(12) United States Patent
Glenn

(10) Patent No.: US 7,601,990 B2
(45) Date of Patent: Oct. 13, 2009

(54) METHOD AND APPARATUS FOR ELECTROSTATIC DISCHARGE PROTECTION HAVING A STABLE BREAKDOWN VOLTAGE AND LOW SNAPBACK VOLTAGE

(75) Inventor: Jack L. Glenn, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 337 days.

(21) Appl. No.: 11/586,412

(22) Filed: Oct. 25, 2006

(65) Prior Publication Data

US 2008/0099848 A1 May 1, 2008

(51) Int. Cl.
*H01L 29/72* (2006.01)
(52) U.S. Cl. .................. 257/168; 257/173; 257/355; 257/509; 257/546; 257/567; 257/583; 438/322; 438/333; 438/362
(58) Field of Classification Search ................ 257/168, 257/173, 355, 509, 546, 567, 583; 438/322, 438/333, 362
See application file for complete search history.

(56) References Cited

U.S. PATENT DOCUMENTS

2008/0061368 A1 * 3/2008 Williams et al. ............ 257/336

* cited by examiner

*Primary Examiner*—Edward Wojciechowicz
(74) *Attorney, Agent, or Firm*—Jimmy L. Funke

(57) ABSTRACT

Electrostatic discharge (ESD) protection is provided for an integrated circuit. Snap back from a lower initial critical voltage and critical current is provided, as compared to contemporary designs. A dynamic region having doped regions is formed on a substrate, interconnects contacting the dynamic region. The dynamic region includes an Nwell region, a Pwell region and shallow diffusions, defining a PNP region, an NPN region and a voltage Breakdown region. In an aspect, the Nwell region includes a first N+ contact, a first P+ contact and an N+ doped enhancement, while the Pwell region includes a second N+ contact, a second P+ contact and a P+ doped enhancement. The N+ doped enhancement contacts the P+ doped enhancement forming the breakdown voltage region therebetween, in one case forming a buried breakdown voltage junction. Independent control is provided over breakdown voltage, NPN critical voltage, NPN critical current and PNP critical current, by varying doping levels, widths and positioning of various doping regions.

22 Claims, 6 Drawing Sheets

METHOD AND APPARATUS FOR ELECTROSTATIC DISCHARGE PROTECTION HAVING A STABLE BREAKDOWN VOLTAGE AND LOW SNAPBACK VOLTAGE

FIELD OF THE INVENTION

The invention relates generally to a semiconductor integrated circuit, and more particularly to electrostatic discharge protection having a highly stable and low breakdown voltage, critical voltage and snapback voltage, which are independently controlled.

BACKGROUND OF THE INVENTION

Numerous electronic circuits require protection from damage due to electrostatic discharge (ESD) caused by rapid discharge of static electricity from one conductor to another having a different potential. ESD can damage integrated circuits in computers, communication equipment, and countless other types of electronic equipment. Semiconductor circuits and components built to provide ESD protection are conventionally implemented using components such as Shockley diodes, thyristors, latches, silicon controlled rectifiers (SCR) and metal gate field oxide (MGFO) devices. These conventional devices provide ESD protection between two terminals, and are typically constructed to snapback at a particular voltage and current, which may be too high for satisfactory ESD protection, and which is dictated by the doping levels of the diffusions that break down.

The ESD protection devices conventionally available generally suffer from lack of control of the breakdown voltage and critical voltage, due to physical design parameters. Conventional devices also rely on the avalanche breakdown of a surface junction, which can drift over repeated ESD strikes. With the advent of complex electronic circuits and smart power integrated circuits (ICs), design requirements now require even lower breakdown and snapback voltages for ESD protection, which are also stable over time. Devices that can snapback at a low voltage and current are finding an increasing need in applications including automotive and residential electronics. Since conventional ESD protection fails to handle sufficiently low snapback voltages and currents, a snapback voltage requirement for a particular device may require having to design a new device.

Therefore, a need exists to provide an ESD protection device that snaps back at a tightly controlled low voltage and current, which are stable over time. Further, such a device structure should be flexible enough to provide varying ESD properties without significant redesign of the device structure or addition/deletion of a significant number of doping regions.

SUMMARY OF THE INVENTION

The present invention provides an SCR device and method to protect low voltage circuit input and outputs against electrostatic discharge (ESD), such as may be used in an integrated circuit. The present invention snaps back at a lower initial voltage as compared to contemporary designs and therefore protects a device from destructive failure, such as a metal oxide semiconductor field effect transistor (MOSFET). Additionally, the breakdown voltage is highly stable over time, even with repeated ESD strikes. The present invention also snaps back at a lower initial current as compared to contemporary designs and thus may be scaled down in size, saving device layout area. The present invention provides for independent control over breakdown voltage, NPN critical voltage, NPN critical current and PNP critical current, for an ESD event.

Features of the invention are achieved in part by employing a platform region, an interconnect region and a dynamic region. In an embodiment, the platform region includes a P-doped substrate. The interconnect region includes a first interconnect and a second interconnect. The dynamic region includes an Nwell region and a Pwell region, defining a PNP region, an NPN region and a voltage Breakdown region. The Nwell and Pwell regions are situated adjacent to the P-doped substrate.

Within the dynamic region the Nwell region contacts the first interconnect, and the Pwell region contacts the second interconnect. The Nwell region includes a first N+ contact, a first P+ contact and an N+ doped enhancement. The Pwell region includes a second N+ contact, a second P+ contact and a P+ doped enhancement. The N+ doped enhancement is positioned in contact with the P+ doped enhancement forming a breakdown voltage region therebetween. The first P+ contact operates as a PNP emitter, the Nwell region operates as a PNP base and a NPN collector, the second N+ contact operates as an NPN emitter, and the Pwell region operates as a PNP collector and an NPN base. The first N+ contact operates as an NPN collector contact, and the second P+ contact operates as a PNP collector contact.

The breakdown voltage, measured from the first interconnect to the second interconnect, is adjusted by varying the doping of the N+ doped enhancement, the doping of the P+ doped enhancement, or an amount of contact area of the N+ doped enhancement with the P+ doped enhancement. Further, in an embodiment, the P+ doped enhancement within the Pwell region is positioned completely enclosed by the N+ doped enhancement, wherein a buried junction is formed and breakdown occurs entirely below the surface and remains highly stable over time. The NPN critical current, measured from the first interconnect to the second interconnect, is adjusted by varying a width of the second N+ contact multiplied by the Pwell sheet resistance adjacent to the second N+ contact. The NPN critical voltage, measured from the first interconnect to the second interconnect, is adjusted by varying a distance between the Nwell region and the P+ doped enhancement, or a contact area of the P+ doped enhancement with a field oxide, wherein the field oxide is positioned between the N+ doped enhancement and the second N+ contact. The PNP critical current, measured from the first interconnect to the second interconnect, is adjusted by varying the NPN current gain or the PNP current gain. The NPN current gain (beta) is adjusted by varying a width of the second N+ contact multiplied by the Pwell sheet resistance adjacent to the second N+ contact. The PNP current gain (beta) is adjusted by varying a width of the first P+ contact multiplied by the Nwell sheet resistance adjacent to the first P+ contact.

Other features and advantages of this invention will be apparent to a person of skill in the art who studies the invention disclosure. Therefore, the scope of the invention will be better understood by reference to an example of an embodiment, given with respect to the following figures.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE INVENTION

Figure 1:
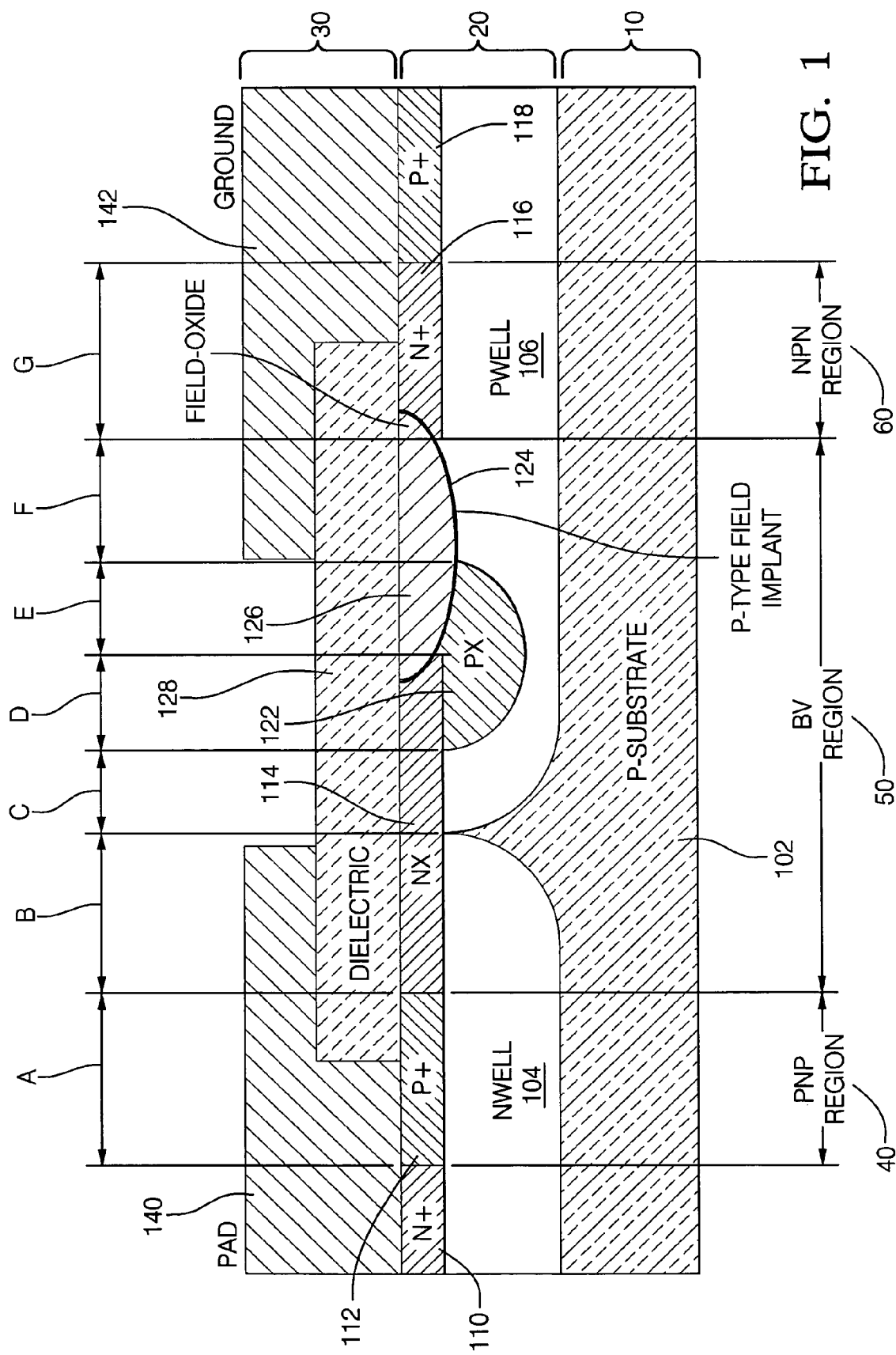
FIG. 1 is cross sectional view illustrating an ESD protection device having a PNP region, an NPN region and a breakdown region, in accordance with an embodiment of the present invention.

Exemplary embodiments are described with reference to specific configurations. Those of ordinary skill in the art will appreciate that various changes and modifications can be made while remaining within the scope of the appended claims. Additionally, well-known elements, devices, components, methods, process steps and the like may not be set forth in detail in order to avoid obscuring the invention. Further, unless indicated to the contrary, the numerical values set forth in the following specification and claims are approximations that may vary depending upon the desired characteristics sought to be obtained by the present invention.

A silicon controlled rectifiers (SCR) system and method is described herein for protecting low voltage circuit input and outputs against electrostatic discharge (ESD), such as may be used in an integrated circuit. The present invention snaps back at a lower initial voltage, wherein the breakdown voltage can be tightly controlled and remains highly stable over time, and therefore protects a device from destructive failure, such as a metal oxide semiconductor field effect transistor (MOSFET). The present invention also snaps back at a lower initial current as compared to contemporary designs and thus may be scaled down in size, saving device layout area. Independent control is provided over breakdown voltage, NPN critical voltage, NPN critical current and PNP critical current, for an ESD event.

Characteristics of ESD protection previously described are controlled by device geometries in a layer of doping defined herein as a dynamic region. In an embodiment, the dynamic region is characteristically formed on a platform region including a fixed P-substrate, providing the ability to redesign a device structure to meet changing ESD voltage requirements without having to entirely redesign a device. Changing ESD voltage requirements include breakdown voltages, critical voltages and critical currents.

As used herein, the term "semiconductor device" is an electronic component with electronic properties of a semiconductor material such as silicon, germanium and gallium arsenide. As used herein, the term "doping type" refers to the resulting charge conduction property of a semiconductor when certain type of atoms are added to the semiconductor in order to increase the number of free positive or negative charge carriers. When the resulting semiconductor contains excessive positive charge carriers or holes, the doping type is defined as P-type. When the resulting semiconductor contains excessive negative charge carriers or electrons, the doping type is defined as N-type. Additionally, the symbols P+ and N+ are used to indicate higher concentrations of P-type and N-type doping, respectively. Also as used herein, the term "dynamic region" refers to a collection of one or more doping regions grown on a substrate such that the voltage-current characteristics of the resulting ESD protection device are primarily controlled by geometry and doping levels of the regions at this layer. Further, as used herein, the term "terminal" refers to an electrical contact point, to which an interconnected is connected. Such a contact point includes a pin on a semiconductor device, a pad on an electronic circuit, etc.

Referring to the drawings wherein identical reference numerals denote the same elements throughout the various views, FIG. 1 illustrates a cross sectional view of an ESD protection device having a PNP region, an NPN region and a breakdown region, in accordance with an embodiment of the present invention. A platform region 10, a dynamic region 20, and an interconnect region 30 are shown. As will be appreciated, the present invention dynamic region 20 can be formed on a different platform region as that shown. The illustrated platform region 10 is established including a P-type substrate 102.

A dynamic region 20 is established including an Nwell region 104 and a Pwell region 106, formed on the P-type substrate 102. These well regions are formed sufficiently deep to accommodate further diffusions. As an example, Nwell region 104 and Pwell region 106 are formed 4 micrometers deep. A layer of field oxide 126 and a P-type field implant 124 is then grown on top of the well regions. The P-type field implant 124 is optional but is typically formed with the field oxide 126. Shallow contact P+ diffusion regions 112 and 118, and shallow contact N+ diffusion regions 110 and 116, are next formed. An N+ doped enhancement 114 is further formed within both the Nwell region 104 and the Pwell region 106. In an example, the shallow diffusion regions 110, 112, 114, 116 and 118 are formed about 0.3 micrometers deep. The Pwell region 106 further includes a P+ doped enhancement 122, such that the N+ doped enhancement 114 is positioned in contact with the P+ doped enhancement 122 forming a breakdown voltage region therebetween. The P+ doped enhancement 122 is formed about 2 micrometers deep, in an example. A dielectric layer 128 and two metallization contact features, namely, Pad connection 140 and Ground connection 142 are established. It is to be appreciated that other levels of interconnect and intervening dielectric can be added to the described interconnect region 30. The shallow doping regions 110, 112, 114, 116, 118, and 122 and the well regions 104 and 106 are defined herein as the dynamic region. As described infra, by varying the spacing and dimensions of these regions, independent control of the breakdown voltage, NPN critical voltage, NPN critical current, and PNP critical current of the device is provided, which is useful for ESD protection.

Figure 2:
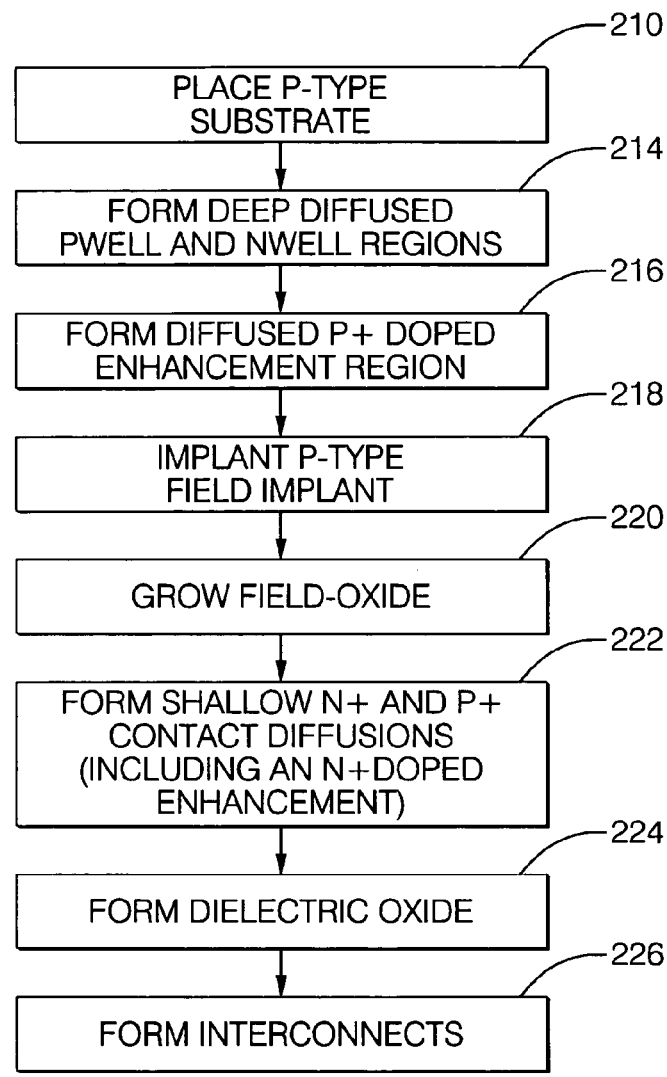
FIG. 2 illustrates example steps in fabrication of the device as in FIG. 1, in accordance with an embodiment of the present invention.

FIG. 2 illustrates example steps in fabrication of the device as in FIG. 1, in accordance with an embodiment of the present invention. In step 210, a P-type substrate is established. Next, in step 214, a diffusion well of P+ doping (Pwell) and a diffusion well of N+ doping (Nwell) is formed on the P-type substrate. In step 216, a P+ doped enhancement diffused region is then formed within the Pwell region. In step 218, a P-type field implant is implanted above a portion of the P-well region, optionally in contact with the P+ doped enhancement diffusion. Next, in step 220, a layer of field oxide is grown above a portion of the P-well region. In step 222, a shallow N+ diffusion and a shallow P+ diffusion are formed in the Nwell region. Also, a shallow N+ diffusion and a shallow P+ diffusion are formed in the Pwell region. An N+ doped enhancement is further formed within both the Nwell region and the Pwell region. The P+ doped enhancement region may also be formed at this step. Steps 214, 216 and 222 are fabrication steps for the dynamic region. In step 224 a dielectric oxide layer is formed above some of the shallow diffusion layers. In step 226, interconnects are formed. One interconnect contact is positioned above the Nwell region and the other interconnect contact is positioned above the Pwell region. The interconnect contact designated Pad 140 contacts the N+ and P+ shallow diffusion layers of the Nwell region. The interconnect contact designated Ground 142 contacts the N+ and P+ shallow diffusion layers of the Pwell region.

Figure 3:
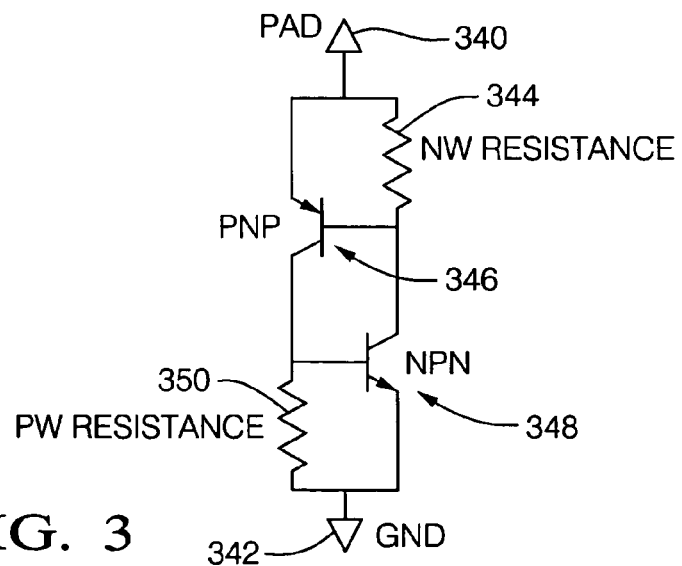
FIG. 3 is a schematic view of a simplified transistor operation of an ESD protection device, in accordance with an embodiment of the present invention.

Referring to FIG. 3, a schematic view is shown of a simplified transistor operation of an ESD protection device, in accordance with an embodiment of the present invention. The circuit includes a PNP transistor 346, an NPN transistor 348, a Pad interconnect 340, a Ground interconnect 342, an Nwell region resistance 344, and a Pwell region resistance 350, connected in a SCR configuration.

Figure 4:
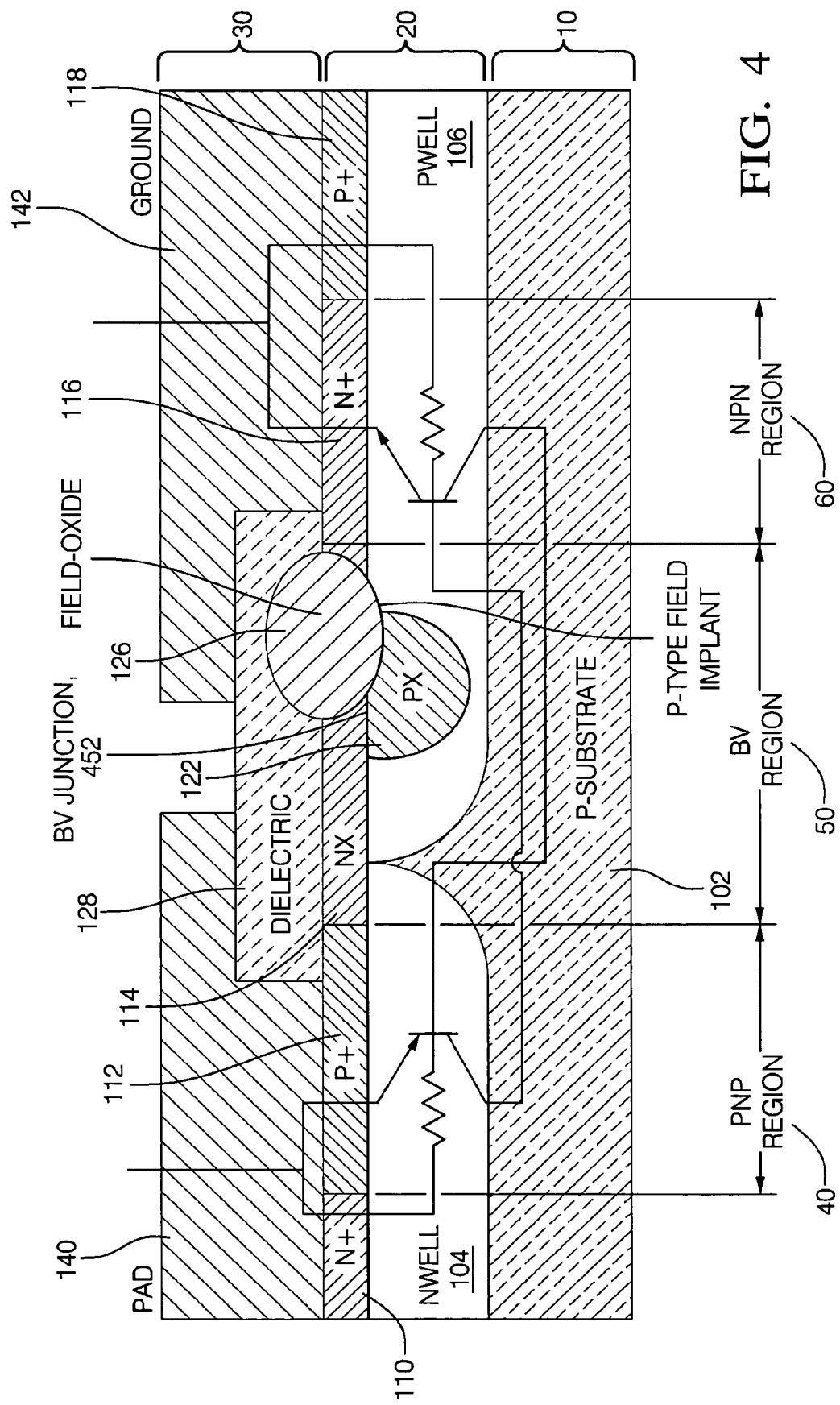
FIG. 4 is cross sectional view illustrating the ESD protection device as in FIG. 1 having an overlay of the simplified electrical schematic as in FIG. 3, in accordance with an embodiment of the present invention.

FIG. 4 is cross sectional view illustrating the ESD protection device as in FIG. 1 having an overlay of the simplified electrical schematic as in FIG. 3, in accordance with an embodiment of the present invention. Three independently controlled regions are shown. The PNP region 40 is shown including the Nwell region 104, the Breakdown voltage region 50 is shown including the contact point between N+ doped enhancement 114 and P+ doped enhancement 122, and the NPN region 60 is shown including the Pwell region 106. The P+ contact 112 operates as a PNP emitter, the Nwell region 104 operates as a PNP base and an NPN collector, the N+ contact 116 operates as an NPN emitter, and the Pwell region 106 operates as a PNP collector and an NPN base. The N+ contact 110 operates as an NPN collector contact, and the P+ contact 118 operates as a PNP collector contact. The doping profiles, dimensions and other factors as discussed infra of the three regions affect the breakdown voltage, NPN characteristics and PNP characteristics.

Figure 5:
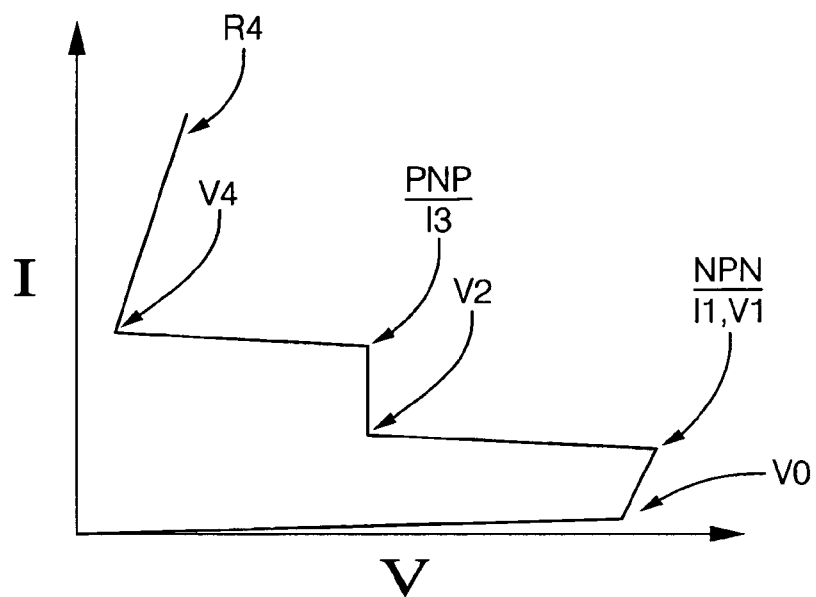
FIG. 5A is a graphical illustration of NPN breakdown voltage, NPN critical voltage and critical current, BVceo voltage, PNP critical current, snapback voltage, as well as the on-resistance of the device as in FIG. 1 and FIG. 4, in accordance with an embodiment of the present invention.
FIG. 5B is a graphical illustration of independently variable breakdown voltages, critical voltages and critical currents of the device as in FIG. 1 and FIG. 4, in accordance with an embodiment of the present invention.
Figure 5:
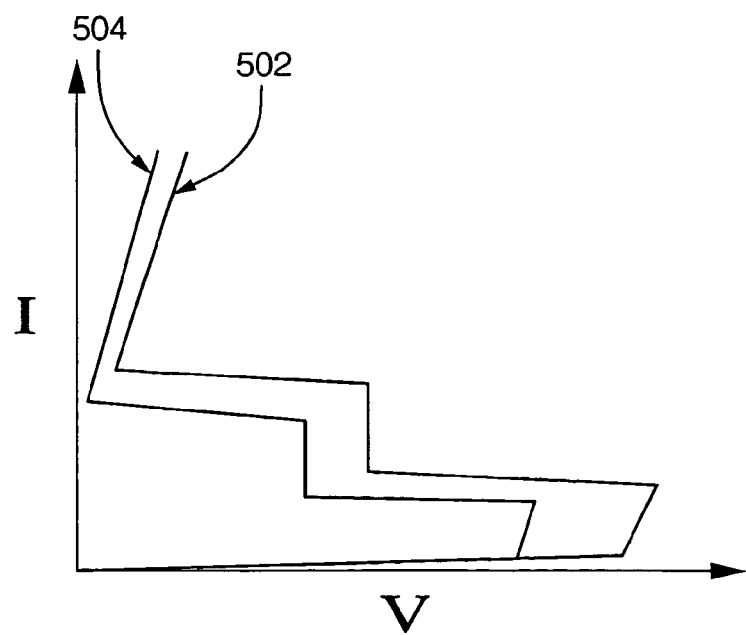

FIG. 5A is a graphical illustration of NPN breakdown voltage (V0), NPN critical voltage (V1) and critical current (I1), BVceo voltage (V2), PNP critical current (I3), snapback voltage (V4), as well as the on-resistance (R4) of the device as in FIG. 1 and FIG. 4, in accordance with an embodiment of the present invention. The X-axis labeled "V" in FIG. 5A represents the voltage measured between Pad 140 and Ground 142 as in FIG. 1. The Y-axis labeled "I" represents current measured through the device between Pad 140 and Ground 142 plotted on a logarithmic scale. During the regular operation of the device when the voltage measured between the Pad 140 and Ground 142 is small, the NPN and PNP transistors between Pad 140 and Ground 142 are turned off, and the present invention device is in off state.

When a positive ESD transient is applied to the Pad interconnect 140, the N+ doped enhancement 114 to P+ doped enhancement 122 connecting region (voltage breakdown area 452) breaks down at a voltage V0. Electron current flows from the voltage breakdown area 452, to the Pad interconnect 140 via the N+ doped enhancement 114 to Nwell region 104 to the N+ contact diffusion 110. Simultaneously, hole current flows from the voltage breakdown area 452 to the Ground interconnect 142 via the P+ doped enhancement 122 to Pwell region 106 to the P+ contact diffusion 118. As current through the device is increased, the terminal voltage increases as a function of the dimensions A through G (FIG. 1), and as a function of the sheet resistance of the diffusions through which the current flows. The NPN critical current (I1) and the NPN critical voltage (V1) are reached at the point shown as I1 and V1 when sufficient current flows through the Pwell region 106 adjacent to the N+ diffusion 116 to turn on the NPN. The NPN then drops back to the open base collector to emitter breakdown voltage (BVceo), shown as voltage V2. As additional current flows through the device, the NPN collector current eventually reaches the PNP critical current I3, where sufficient voltage drop occurs across the Nwell region 104 to turn on the PNP. When the PNP achieves sufficient current gain that the product of the NPN current gain and the PNP current gain equals unity, then the device snaps back to the snapback voltage V4. As additional current flows through the device, the terminal voltage increases with a resistance R4.

Referring again to FIG. 1, the breakdown voltage (V0) at voltage breakdown area 452, measured from the Pad interconnect 140 to the Ground interconnect 142, is adjusted by varying the doping of the N+ doped enhancement 114, the doping of the P+ doped enhancement 122, or an amount of contact area between the N+ doped enhancement with the P+ doped enhancement (dimension D). Also, dimension B must be sufficiently large to prevent punch-through between the PNP emitter (P+ diffusion 112) and the P+ doped enhancement 122, in order to avoid artificially reducing the breakdown voltage. The NPN critical current (I1), measured from the Pad interconnect 140 to the Ground interconnect 142, is adjusted by varying a width of the N+ contact 116 (dimension G) multiplied by the Pwell 106 sheet resistance adjacent to the N+ contact 116. The dimension G multiplied by the Pwell 106 sheet resistance adjacent to the N+ contact 116 can also set the NPN current gain (beta). Further, dimension F is set appropriately to ensure that the P+ doped enhancement 122 does not encroach on the NPN emitter 116. In some experimental samples, a larger width of the N+ contact 116 (dimension G), which is the NPN emitter, provided a lower critical current. The NPN critical voltage (V1), measured from the Pad interconnect 140 to the Ground interconnect 142, is adjusted by varying a distance between the Nwell region 104 and the P+ doped enhancement 122 (dimension C), or a contact area of the P+ doped enhancement 122 with the field oxide 126 (dimension E), wherein the field oxide 126 is positioned between the N+ doped enhancement 114 and the N+ contact 116. The PNP critical current (I3), measured from the Pad interconnect 140 to the Ground interconnect 142, is adjusted by varying the NPN current gain or the PNP current gain. The PNP current gain (beta) is adjusted by varying a width (dimension A) of the P+ contact 112 (PNP emitter) multiplied by the Nwell 104 sheet resistance adjacent to the P+ contact 112.

FIG. 5B is a graphical illustration of independently variable breakdown voltages, critical voltages and critical currents of the device as in FIG. 1 and FIG. 4, in accordance with an embodiment of the present invention. Line 502 represents one embodiment of the device having one example doping profile and transistor element dimensions. Line 504 represents another embodiment of the device having another example doping profile and transistor element dimensions. As previously described, the doping profiles, dimensions and other factors of the three regions affect the breakdown voltage, NPN characteristics and PNP characteristics. Also, it is to be appreciated that the lines 502 and 504 represent only two examples of numerous other option device designs.

Figure 6:
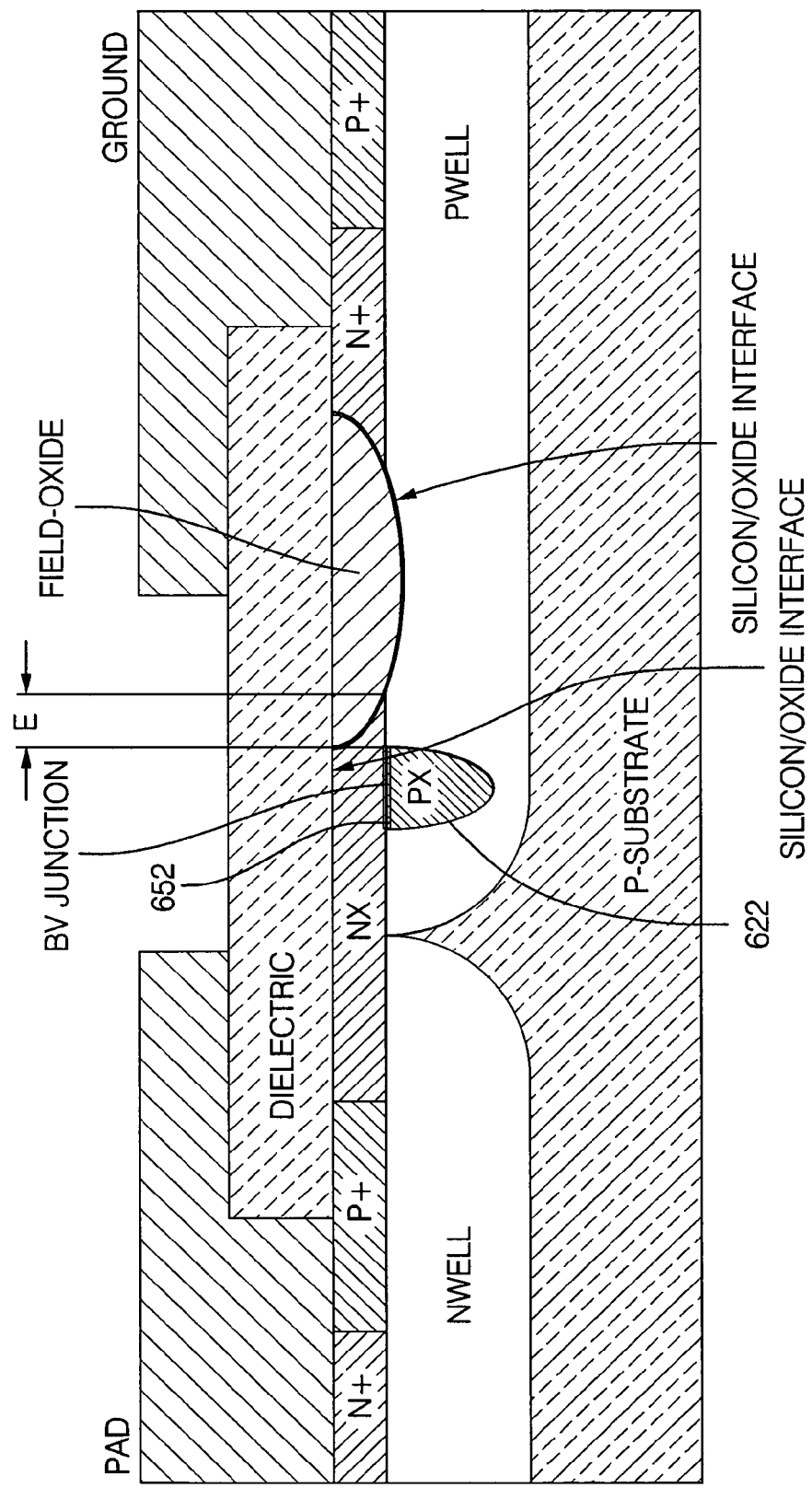
FIG. 6 is cross sectional view illustrating an ESD protection device with a P+ doped enhancement situated in contact with an N+ doped enhancement forming a buried junction breakdown voltage region therebetween, in accordance with an embodiment of the present invention.

Referring to FIG. 6, a cross sectional view is illustrated of an ESD protection device with a P+ doped enhancement within a Pwell region, which is fully enclosed by an N+ doped enhancement forming a buried junction breakdown voltage junction 652 therebetween. As a further independent control over the breakdown voltage, dimension E (shown in FIG. 1) is set to zero or negative such that the N+ doped enhancement 114 within the Pwell region 106 is positioned to contact only the P+ doped enhancement 622 at Breakdown voltage junction 652. Breakdown occurs at Breakdown voltage junction 652 where the N+ doped enhancement and the P+ doped enhancement overlap. This positioning of the P+ doped enhancement 622 can ensure that breakdown occurs below the surface of the wafer, away from the oxide/silicon interface. This is significant since avalanche induced electrons and holes can damage the interface and create a fixed charge when breakdown occurs at a point near the oxide/silicon interface, potentially changing the breakdown voltage. With each successive ESD event, greater charge can build up and the breakdown voltage can drift. Additionally, the buried junction 652 has a tighter initial breakdown voltage distribution since variation in interfacial fixed charge will not cause the initial breakdown voltage to vary. Thus, the buried junction 652 maintains a tighter process control as compared to a surface junction.

Figure 7:
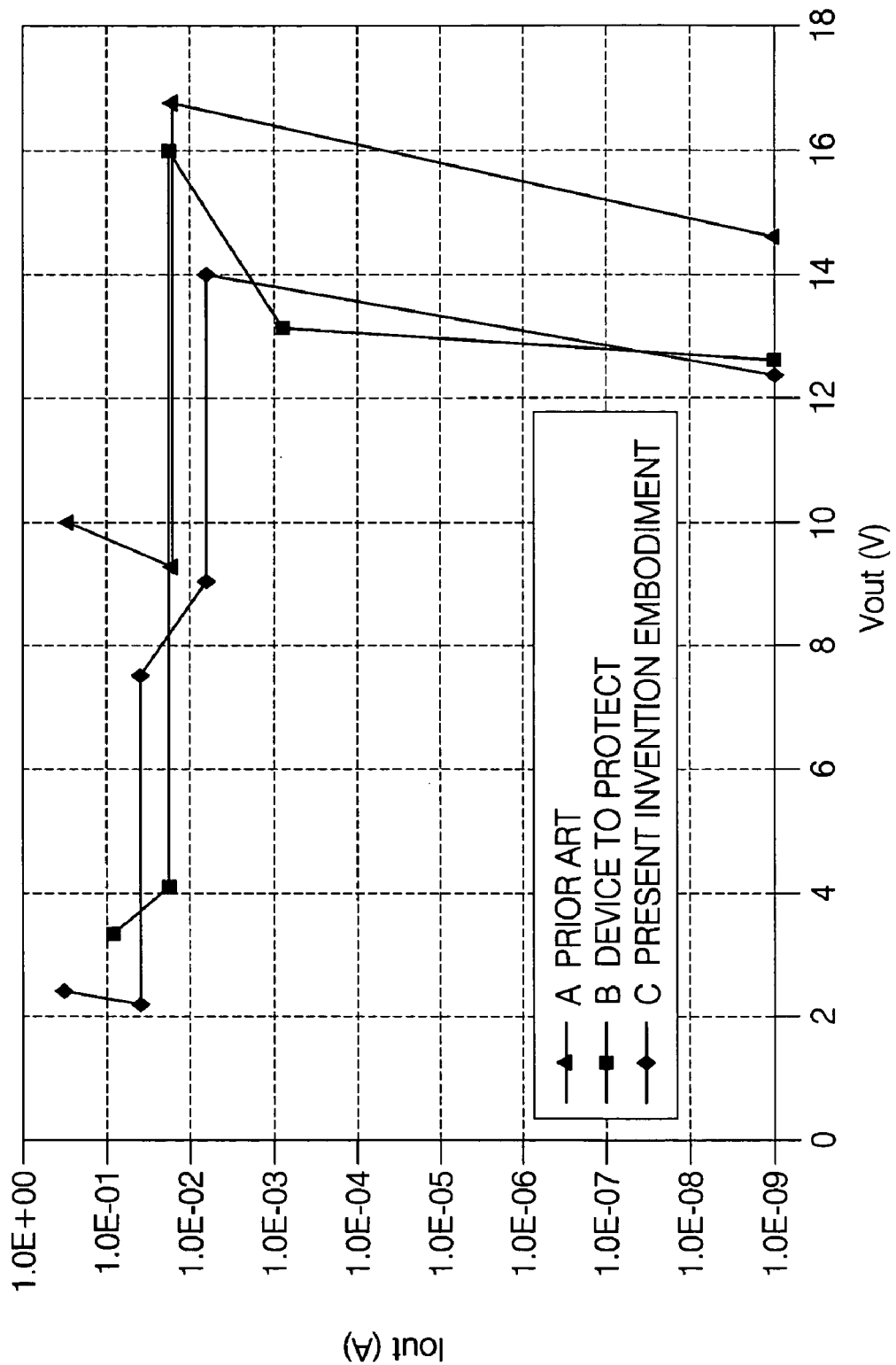
FIG. 7 is a graphical illustration of example breakdown voltages, critical voltages and snapback voltages for the ESD protection device as in FIG. 1 and FIG. 4, in accordance with an embodiment of the present invention, as compared to a conventional ESD protection device and a device without ESD protection.

A further understanding of the above description can be obtained by reference to the following experimental result example that is provided for illustrative purposes and are not intended to be limiting. FIG. 7 is a graphical illustration of example breakdown voltages, critical voltages and snapback voltages for the ESD protection device as in FIG. 1 and FIG. 4, as compared to a conventional ESD protection device and a device without ESD protection. The X-axis labeled "Vout (V)" represents the voltage measured between Pad 140 and Ground 142 as in FIG. 1. The Y-axis labeled "Iout (A)" represents current measured through the device between Pad 140 and Ground 142 plotted on a logarithmic scale. Line A represents a contemporary device, showing breakdown voltage, critical voltage, and snapback voltage. Line B represents a device without ESD protection (to be ESD protected), showing breakdown voltage, critical voltage, and snapback voltage. Line C represents an embodiment of the invention having an example doping profile and transistor element dimensions, showing the breakdown voltage, critical voltage, and snapback voltage.

As may be observed, the line A contemporary device and line B device to be protected show substantially similar critical voltages and critical currents prior to snapback. Being substantially similar in critical voltages and critical currents, the contemporary line A device has limited use to protect the line B device. However, the line C present invention embodiment illustrates a lower critical voltage, a lower critical current, and snaps back at a lower current level, in comparison to the line A contemporary device and the line B device to be protected. It is to be appreciated that line C represents only one example of numerous present invention device doping and dimension designs, and thus the breakdown voltage, critical voltage and snapback voltage shown can be adjusted as described supra.

Other features and advantages of this invention will be apparent to a person of skill in the art who studies this disclosure. Thus, exemplary embodiments, modifications and variations may be made to the disclosed embodiments while remaining within the spirit and scope of the invention as defined by the appended claims.

I claim:

1. An electrostatic discharge protection device, comprising:
    an interconnect region having a first interconnect and a second interconnect;
    a dynamic region including an Nwell region contacting the first interconnect, and a Pwell region contacting the second interconnect, wherein the Nwell region includes a first N+ contact, a first P+ contact and a N+ doped enhancement, wherein the Pwell region includes a second N+ contact, a second P+ contact and a P+ doped enhancement, and wherein the N+ doped enhancement is positioned in contact with the P+ doped enhancement forming a breakdown voltage region therebetween; and
    a platform region including a P-doped substrate situated adjacent to the Nwell region and the Pwell region;
    wherein at least one of a breakdown voltage and an NPN critical current, measured from the first interconnect to the second interconnect, is set independently,
    wherein the breakdown voltage between the first and second interconnect region is determined by at least one of the doping of the N+ doped enhancement, the doping of the P+ doped enhancement, and an amount of contact area of the N+ doped enhancement with the P+ doped enhancement, and
    wherein the NPN critical current is determined by a width of the second N+ contact multiplied by the Pwell sheet resistance adjacent to the second N+ contact.

2. The electrostatic discharge protection device as in claim 1, wherein an NPN critical voltage is determined by at least one of a distance between the Nwell region and the P+ doped enhancement, and a contact area of the P+ doped enhancement with a field oxide, wherein the field oxide is positioned between the N+ doped enhancement and the second N+ contact.

3. The electrostatic discharge protection device as in claim 1, wherein a PNP critical current is determined by at least one of a NPN current gain and a PNP current gain, wherein the NPN current gain is determined by a width of the second N+ contact multiplied by the Pwell sheet resistance adjacent to the second N+ contact, and the PNP current gain is determined by a width of the first P+ contact multiplied by the Nwell sheet resistance adjacent to the first P+ contact.

4. The electrostatic discharge protection device as in claim 3, wherein the PNP critical current is reached when a product of the NPN current gain and the PNP current gain exceeds unity.

5. The electrostatic discharge protection device as in claim 3, wherein the breakdown voltage, the NPN critical current, an NPN critical voltage, and the PNP critical current are each independently controlled.

6. The electrostatic discharge protection device as in claim 1, wherein the P+ doped enhancement is situated having a predetermined distance from a field oxide, wherein the field oxide is positioned between the N+ doped enhancement and the second N+ contact.

7. The electrostatic discharge protection device as in claim 1, wherein the P+ doped enhancement, situated within the Pwell region, is fully enclosed by the N+ doped enhancement, forming a buried breakdown voltage junction.

8. The electrostatic discharge protection device as in claim 1, wherein at least one of the first N+ contact is doped the same as the N+ doped enhancement, and the second P+ contact is doped the same as the P+ doped enhancement.

9. The electrostatic discharge protection device as in claim 1, further comprising a P-type field implant on a field oxide included in the dynamic region, wherein the P– type field implant contacts the N+ doped enhancement, the P+ doped enhancement, the Pwell region, and the second N+ contact.

10. The electrostatic discharge protection device as in claim 1, wherein the first interconnect is attached to one of a drain and a source of a metal oxide semiconductor field effect transistor (MOSFET).

11. An electrostatic discharge protection device, comprising:
   a PNP transistor having a PNP emitter, a PNP collector and a PNP base; and
   an NPN transistor having an NPN emitter, an NPN collector, and an NPN base;
   wherein the PNP emitter is connected to a first interconnect, the PNP collector is connected to the NPN base and connected to a second interconnect via a Pwell region having a Pwell resistance, the PNP base is connected to the NPN collector and connected to the first interconnect via an Nwell region having an Nwell resistance, the NPN emitter is connected to the second interconnect, and the Pwell region includes a P+ doped enhancement situated in contact with an N+ doped enhancement forming a breakdown voltage region therebetween;
   wherein at least one of a breakdown voltage and an NPN critical current, measured from the first interconnect to the second interconnect, set independently;
   wherein the breakdown voltage between the first and second interconnect regions is determined by varying at least one of the N+ doped enhancement doping, the P+ doped enhancement doping, and an amount of contact area of the N+ doped enhancement with the P+ doped enhancement; and
   wherein the NPN critical current is determined by a width of the NPN emitter multiplied by the Pwell region sheet resistance adjacent to the NPN emitter.

12. The electrostatic discharge protection device as in claim 11, wherein an NPN critical voltage is determined by at least one of a distance between the Nwell region and the P+ doped enhancement, and a contact area of the P+ doped enhancement with a field oxide, wherein the field oxide is positioned between the N+ doped enhancement and the NPN emitter.

13. The electrostatic discharge protection device as in claim 11, wherein a PNP critical current is determined by at least one of a NPN current gain and a PNP current gain, wherein the NPN current gain is determined by a width of the NPN emitter multiplied by the Pwell region sheet resistance adjacent to the NPN emitter, and the PNP current gain is determined by a width of the PNP emitter multiplied by the Nwell region sheet resistance adjacent to the PNP emitter.

14. The electrostatic discharge protection device as in claim 13, wherein the PNP critical current is reached when a product of the NPN current gain and the PNP current gain exceeds unity.

15. The electrostatic discharge protection device as in claim 11, wherein the P+ doped enhancement is situated having a predetermined distance from a field oxide, wherein the field oxide is positioned between the N+ doped enhancement and the NPN emitter.

16. The electrostatic discharge protection device as in claim 11, wherein the P+ doped enhancement, situated within the Pwell region, is fully enclosed by the N+ doped enhancement, forming a buried breakdown voltage junction.

17. A method for fabricating an electrostatic discharge protection, comprising:
   establishing a PNP transistor having a PNP emitter, a PNP collector and a PNP base;
   establishing an NPN transistor having an NPN emitter, an NPN collector, and an NPN base;
   connecting the PNP emitter to a first interconnect;
   connecting the PNP collector to the NPN base and to a second interconnect via a Pwell region having a Pwell resistance;
   connecting the PNP base to the NPN collector and to the first interconnect via an Nwell region having an Nwell resistance; and
   connecting the NPN emitter to the second interconnect,
   wherein the Pwell region includes a P+ doped enhancement situated in contact with an N+ doped enhancement forming a breakdown voltage region therebetween;
   wherein at least one of a breakdown voltage and an NPN critical current, measured from the first interconnect to the second interconnect, is set independently;
   wherein the breakdown voltage between the first and second interconnect regions is determined by at least one of the N+ doped enhancement doping, the P+ doped enhancement doping, and an amount of contact area of the N+ doped enhancement with the P+ doped enhancement; and
   wherein the NPN critical current is determined by a width of the NPN emitter multiplied by the Pwell region sheet resistance adjacent to the NPN emitter.

18. The method for electrostatic discharge protection as in claim 17, further comprising selecting an NPN critical voltage by setting at least one of a distance between the Nwell region and the P+ doped enhancement, and a contact area of the P+ doped enhancement with a field oxide, wherein the field oxide is positioned between the N+ doped enhancement and the NPN emitter.

19. The method for electrostatic discharge protection as in claim 17, further comprising selecting a PNP critical current by setting at least one of a NPN current gain and a PNP current gain, wherein the NPN current gain is selected by setting a width of the NPN emitter multiplied by the Pwell region sheet resistance adjacent to the NPN emitter, and the PNP current gain is selected by setting a width of the PNP emitter multiplied by the Nwell region sheet resistance adjacent to the PNP emitter.

20. The method for electrostatic discharge protection as in claim 17, further comprising reaching a PNP critical current when a product of the NPN current gain and the PNP current gain exceeds unity.

21. The method for electrostatic discharge protection as in claim 17, further comprising situating the P+ doped enhancement a predetermined distance from a field oxide, wherein the field oxide is positioned between the N+ doped enhancement and the NPN emitter.

22. The method for electrostatic discharge protection as in claim 17, wherein the P+ doped enhancement, situated within the Pwell region, is fully enclosed by the N+ doped enhancement, forming a buried breakdown voltage junction.

* * * * *